United States Patent [19]
Jansson

[11] Patent Number: 6,081,571
[45] Date of Patent: *Jun. 27, 2000

[54] DISCRETE PHASE LOCKED LOOP

[75] Inventor: Johan Jansson, Ljusterö, Sweden

[73] Assignee: Telefonaktiebolaget LM Ericsson, Stockholm, Sweden

[*] Notice: This patent issued on a continued prosecution application filed under 37 CFR 1.53(d), and is subject to the twenty year patent term provisions of 35 U.S.C. 154(a)(2).

[21] Appl. No.: 08/764,934

[22] Filed: Dec. 13, 1996

Related U.S. Application Data

[60] Provisional application No. 60/008,728, Dec. 15, 1995.

[51] Int. Cl.$^7$ ........................................................ H04L 7/00
[52] U.S. Cl. ........................... 375/376; 375/327; 455/502; 455/260
[58] Field of Search ..................................... 375/376, 220, 375/219, 356, 327, 354, 371, 373; 455/561, 260, 503, 502; 370/506, 516, 518, 350, 503; 331/1 A, 25, 18; 327/150, 147, 146, 159, 156, 155, 141, 144, 162, 163

[56] References Cited

U.S. PATENT DOCUMENTS

| | | | |
|---|---|---|---|
| 4,019,153 | 4/1977 | Cox, Jr. et al. | 331/1 A |
| 4,191,975 | 3/1980 | White et al. | 375/371 |
| 4,218,770 | 8/1980 | Weller | 375/118 |
| 4,683,567 | 7/1987 | Green et al. | 370/110.1 |
| 4,808,884 | 2/1989 | Hull et al. | 375/120 |
| 5,293,380 | 3/1994 | Kondo . | |

FOREIGN PATENT DOCUMENTS

| | | |
|---|---|---|
| 037519 | 10/1981 | European Pat. Off. . |
| 252444 | 1/1988 | European Pat. Off. . |
| 335 846 | 10/1989 | European Pat. Off. . |
| 437835 | 7/1991 | European Pat. Off. . |
| 553610 | 8/1993 | European Pat. Off. . |
| 671825 | 9/1995 | European Pat. Off. . |
| 2812774 | 9/1979 | Germany . |
| 4333000 | 4/1995 | Germany . |
| WO91/03136 | 3/1991 | WIPO . |

OTHER PUBLICATIONS

International Search Report re PCT/US96/19652 Date of mailing of search: Aug. 29, 1997.
P.Z. Peebles, Jr., *Digital Communications Systems*, Prentice-Hall, Inc., Sec. 3.6, pp. 107–114 and 306–311.
International Search Report re PCT/US96/19653 Date of mailing of International Search Report: Apr. 24, 1997.
Partial International Search Report re PCT/US96/19652 Date of mailing of search: May 22, 1997.
T. Kurita et al., "A Digital Phase–Locked Loop with AND Filter", Transactions of the Institute of Electronics and Communication Engineers of Japan Section E, vol. 63, No. 5, pp. 367–368 (May 1980).

*Primary Examiner*—Young T. Tse
*Attorney, Agent, or Firm*—Burns, Doane, Swecker & Mathis, L.L.P.

[57] ABSTRACT

A discrete phase-locked loop and method for supporting global synchronization of data communications in a mobile communications system is disclosed. In order to provide for air frame synchronization, air frame data clocks and a synchronization signal must be phase locked to a global time reference signal. This is accomplished through a fully discrete phase lock loop in ASIC or software wherein a state machine is clocked by a high frequency, high accuracy, fixed frequency source already available in the radio terminal equipment. The state machine generates the required air frame data clocks and synchronization signals by completing a counter cycle. At regular intervals, this counter can skip, or double step, for one count to adjust the output phase closer to the phase of the reference signal. The interval for which this correction is maintained is settable by an interval counter. This implementation mimics an elliptic low pass filter.

32 Claims, 12 Drawing Sheets

DISCRETE PHASE LOCKED LOOP

This application claims priority from U.S. Provisional Patent Application Ser. No. 60/008,728 filed on Dec. 15, 1995.

BACKGROUND OF THE INVENTION

The present invention relates generally to data frame synchronization for use in telecommunications systems and more specifically for airframe synchronization through use of a Discrete Phase Locked Loop Solution.

Figure 1:
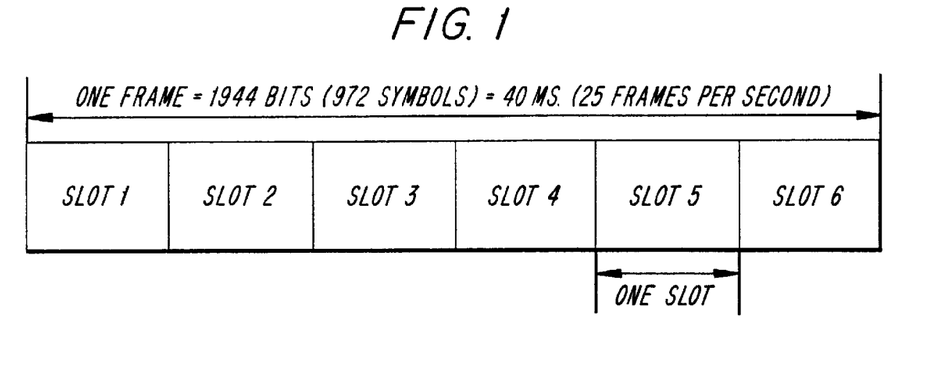
FIG. 1 illustrates a frame with time slots.

Telecommunications systems include various elements within the system that need to be synchronized, to allow data communication between the system's elements. In order to provide system synchronization, a communications system should distribute accurate frequency and time reference signals. For example, in a time division multiple access (TDMA) mobile communications network, a base station transmits bursts of data known as airframes (or simply frames), to mobile units traveling in an area serviced by the base station. In an American Digital Cellular (ADC) system for example, a frame is defined as a digital packet containing six time slots transmitted at a 25 Hertz frame rate. As illustrated in FIG. 1, this exemplary frame format is used in the D-AMPS system specified in EIA/TIA IS-54B. However, those skilled in the art will appreciate that other systems, such as those specified by Global System For Mobile Communication (GSM), may provide different frame/time slot formats and timing.

Figure 2:
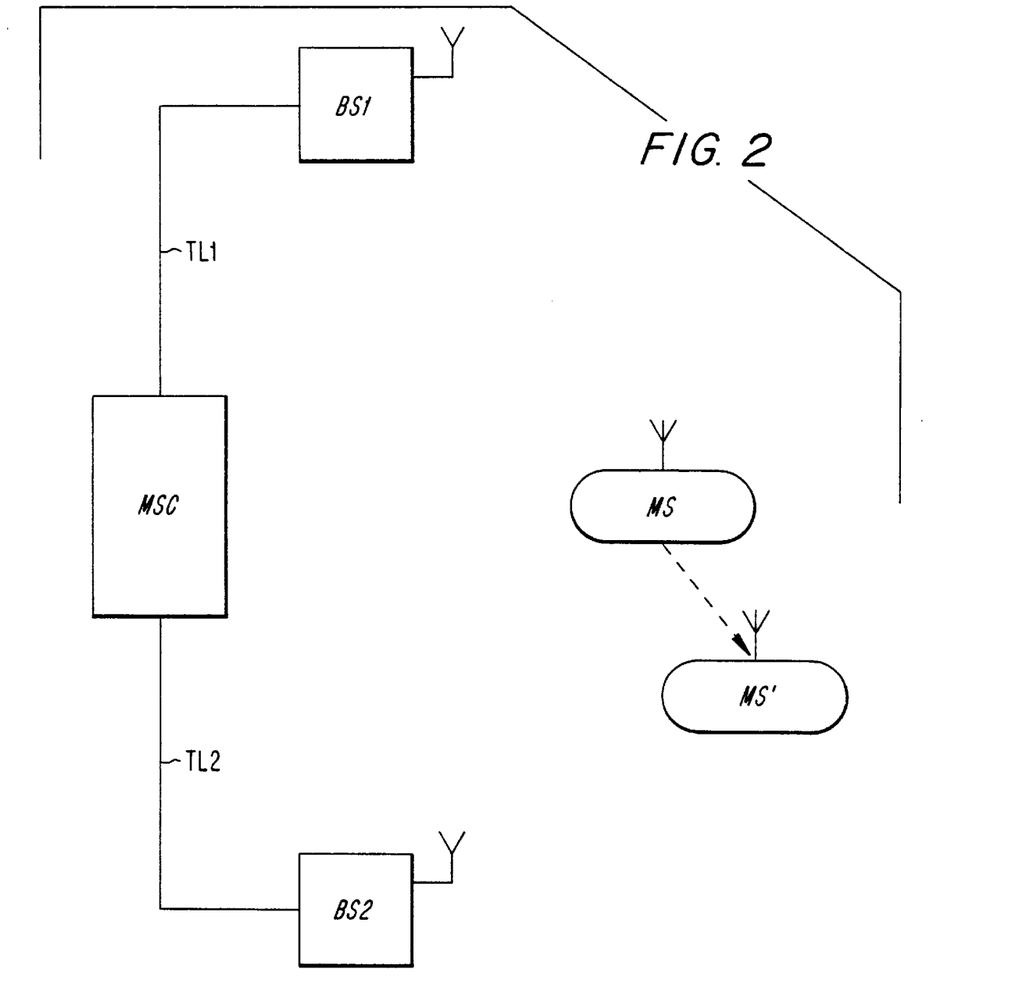
FIG. 2 shows an example of base station communication with a mobile.

Consider the situation depicted in FIG. 2. An original base station BS1 is handling a connection between mobile station MS and the network as represented by the transmission link TL1 between base station BS1 and the mobile switching center MSC. The mobile station MS then moves to a position MS' where it is then determined that this connection would best be handled by base station BS2, e.g., to improve the signal quality of the connection. The system initiates a handoff procedure by sending appropriate commands to base stations BS1 and BS2 over transmission links TL1 and TL2. The mobile station MS may or may not be informed of the impending handoff.

At some time after the handoff decision is made, transmissions will begin from the base station BS2 and terminate from base station BS1. In some cases, e.g., where a mobile station has the capability of performing diversity combination or selection of plural signals, it may be desirable to allow transmission to continue from both base stations for some time period. In other cases, it may be desirable to have little or no overlap in the transmissions from base stations BS1 and BS2. In either scenario, it is important to ensure that no frames are lost during the handoff procedure. Thus, it is desirable that the mobile station cleanly receive a last frame from the original base station BS1 followed by a first frame from base station BS2. This involves at least two timing aspects: (1) estimating the difference in propagation delay between the original base station BS1 and the mobile station MS, and that between the new base station BS2 and the mobile; and (2) synchronizing the transmissions between the base stations so that the frames from each base station arrive at the mobile station at the desired times.

However, providing such synchronization is difficult as there is very little gap time between the transmitted frames. In order to synchronize the transmission of the frames of the two different base stations, BS1 and BS2, a highly accurate and quickly discernible reference signal is needed such that the base stations are time synchronized within, for example, 2 microseconds to ensure the frame decoder in the mobile will not be disturbed by lost or duplicated data.

A second application for the synchronization of airframes in telecommunications systems occurs when a single base station contains multiple transceivers that are each transmitting the same, or substantially the same, information to a mobile unit. The transceivers can be separated within the same base station or base station site or transceivers from neighboring sites can cooperate for a call handled by a common switching center, wherein the neighboring sites are globally synchronized. Each transceiver can transmit at slightly different frequencies in order to avoid interference. As the base station transmits the airframes to a mobile unit, the mobile unit receives each of the signals and combines them such that the signals appear much stronger. This is often referred to as simulcasting. Simulcasting may be achieved by synchronizing the airframe timing of two transceivers and having the transceivers transmit with a known offset relative to each other. However, in order for the mobile station to be able to combine the signals, the transmission of the signals by the base stations must be synchronized. For this application, synchronization between base station transmitters should be determined within, for example, ten microseconds.

Airframe synchronization has not previously been implemented. In order to synchronize the airframes, both airframe data clocks and synchronization signals must be phase locked to a global time reference signal. To minimize system down time, it is desirable to lock synchronization to the reference signal quickly. However, by attempting to reach a locked condition quickly, the chance of vector error is increased which in turn could compromise communications from the transceiver. Therefore, it is desirable to have a communications system that provides a locked condition as quickly as possible without losing an unacceptable amount of data or the connection to the transceiver.

One possible method for providing synchronization would be to use a conventional analog phase-locked loop (PLL). An analog PLL typically contains a voltage controlled crystal oscillator (VCO), a phase comparator, and a low pass filter. The VCO is controlled by the voltage from a low pass filter derived from a phase comparator. The phase comparator compares an incoming reference frequency with a frequency generated by the VCO. In order to provide the accuracy needed to establish synchronization for the applications described above using a conventional analog solution, a VCO with performance better than one part per million (PPM) frequency deviation should be used. However, this type of VCO is very expensive, and its implementation in a PLL is also space demanding.

Another drawback of an analog PLL is the amount of time required to achieve a locked condition including inherent delays that cannot be overcome as the VCO itself will be the source of certain failures and inaccuracies. These delays would make implementation of global airframe synchronization impractical using an analog PLL. For example, to obtain a locked condition using a conventional analog PLL would take on the order of 30 to 70 minutes without compromising a call. In the case of a loss of system power or system soft-reboot, it could take up to 70 minutes to achieve synchronization of the transceivers using an analog PLL. This length of time would be unacceptable for handling calls between a base station and a mobile phone. Moreover, as with all analog devices, an analog PLL is subject to additional inaccuracies attributable to aging of its components.

It is therefore an object of this invention to provide fast dynamic synchronization through use of a global time reference signal without many of the above-described drawbacks. It is also an object of the invention to provide a phase-locked loop having a reduced manufacturing cost that is significantly smaller than conventional analog PLLs. It is a further object of the invention to provide a PLL that suppresses reference error noise, is not adversely affected by aging, and enables faster phase lock response times.

SUMMARY

The foregoing and other objects are accomplished through implementation of a discrete phase-locked loop for supporting global synchronization of data communications in a mobile communications system. In order to provide airframe synchronization, airframe data clocks and a synchronization signal must be phase-locked to a global time reference signal. This synchronization is accomplished by a frequency generator and correlator (FGC) unit incorporating a fully digital phase-locked loop (PLL). The digital PLL includes a timing synthesis sequencing (TSS) unit that is controlled by a state machine and is clocked by a high frequency, high quality, fixed frequency master clock. The TSS in conjunction with the state machine generates the airframe data clock and synchronization signals by completing a counter cycle. At regular intervals the counter can skip, or double step, for one count to adjust the output phase of the digital PLL closer to the phase of a distributed airframe reference signal. The interval for which this correction is maintained is settable by an interval counter. This solution mimics an elliptic low pass filter.

The FGC is a digital solution that can be implemented, for example, as part of an ASIC or as a software routine. According to one preferred embodiment the FGC is implemented as an ASIC that is monitored and controlled by software while maintaining synchronization autonomously with respect thereto. This digital implementation provides a low cost solution with high reliability and good testability. The digital implementation also provides reference noise suppression, reduced size, aging tolerance, and better response times than conventional analog PLL solutions.

BRIEF DESCRIPTION OF THE DRAWINGS

The foregoing and other features, objects and advantages of the invention will be understood by reading the following description in conjunction with the drawings, in which.

DETAILED DESCRIPTION

The various features of the invention will now be described with respect to the figures, in which like parts are identified with the same reference characters.

Analog Phase-locked Loops

Figure 3A:
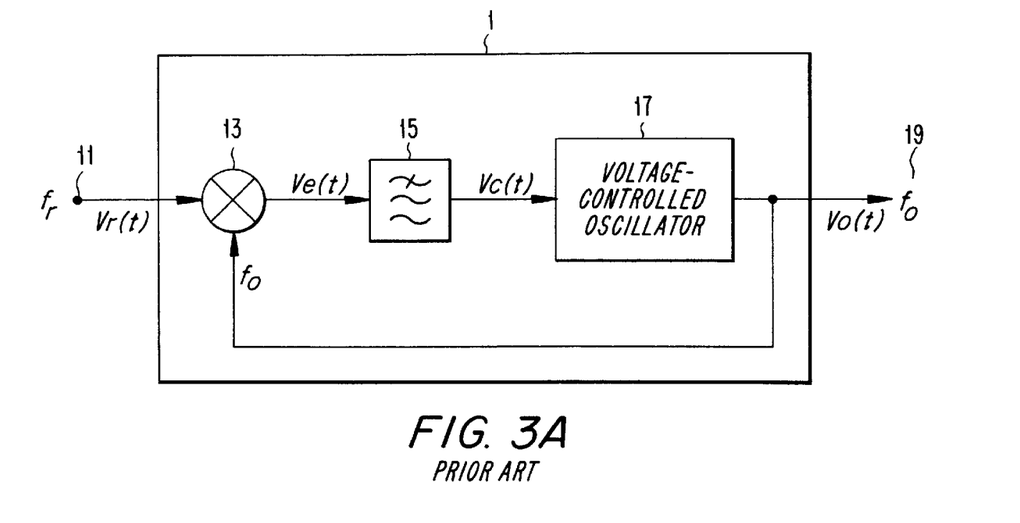
FIG. 3A depicts an analog phase-locked loop according to the prior art.

One of the fundamental circuits in telecommunications systems is the phase-locked loop (PLL). For example, PLLs are typically used for frequency-selective AM or FM demodulation, signal conditioning, and frequency synchronization. FIG. 3A illustrates a basic PLL 1 including a comparator 13, a low pass filter (LPF) 15, and a voltage-controlled oscillator (VCO) 17. The PLL 1 operates as follows. When no signal is input at node 11 to the PLL, the low-pass filtered error voltage Vc(t) is zero and the VCO 17 operates at its free running frequency. When a reference frequency $f_r$ is input at node 11, the comparator 13 compares the frequency of the reference with the VCO frequency $f_o$ and generates an error voltage Ve(t), related to the frequency difference between the two signals. The error voltage Ve(t) is filtered at block 15 and applied to the control terminals of the VCO 17. Thus the control voltage Vc(t) forces the VCO frequency $f_o$ to vary in a direction that reduces the frequency difference between $f_o$ and the reference frequency $f_r$. If the reference frequency $f_r$ is sufficiently close to $f_o$, the feedback loop of the PLL 1 causes the VCO 17 to synchronize, or lock, with the reference frequency fr. Once in a lock state $f_o$ and $f_r$ are identical, except for a finite phase difference.

While a conventional PLL is capable of providing signal synchronization, it is space demanding. Additionally, the conventional PLL is unable to obtain a locked frequency quickly enough when the transceiver enters a traffic mode (e.g., at system power up, after a power loss, soft reboot, or loss of data connection to the switch, reference synchronization signal, or radio frequency reference) to be practical for implementation. Additionally, errors in the reference signal can be propagated into the feedback loop which can cause the system to be placed out of lock and out of the maximum specified error range for proper system operation.

Discrete Phase-locked Loops

Therefore, according to an exemplary embodiment of the present invention, a discrete or digital PLL is provided as a solution to the problems mentioned above, for example, keeping "down time" to a minimum, by providing a system that can quickly lock to a reference frequency. The discrete PLL will now be discussed in greater detail with reference to FIG. 3B. Therein, the digital PLL 2 includes a timing synthesis sequencer TSS 16 which replaces the VCO 17 of the analog PLL shown in FIG. 3A, and in addition includes a control state machine 14. A master clock signal (MCK) supplied from an external oscillator 9 is input to the TSS 16. The TSS 16 includes a binary counter (not shown in FIG. 3B). In order to maintain lock or synchronization with a distributed reference signal $q_r$, the TSS 16 adds or subtracts a small time quantum at regular intervals on the outputted timing signal $q_o$. For example, as commanded by the control state machine (CSM) 14, the binary counter in TSS 16 can be set to continuously increment by one to maintain an uncorrected output signal timing or to lead/lag one time quantum to correct the timing of output signal $q_o$. This process is illustrated in the flow chart of FIG. 3C.

Figure 3B:
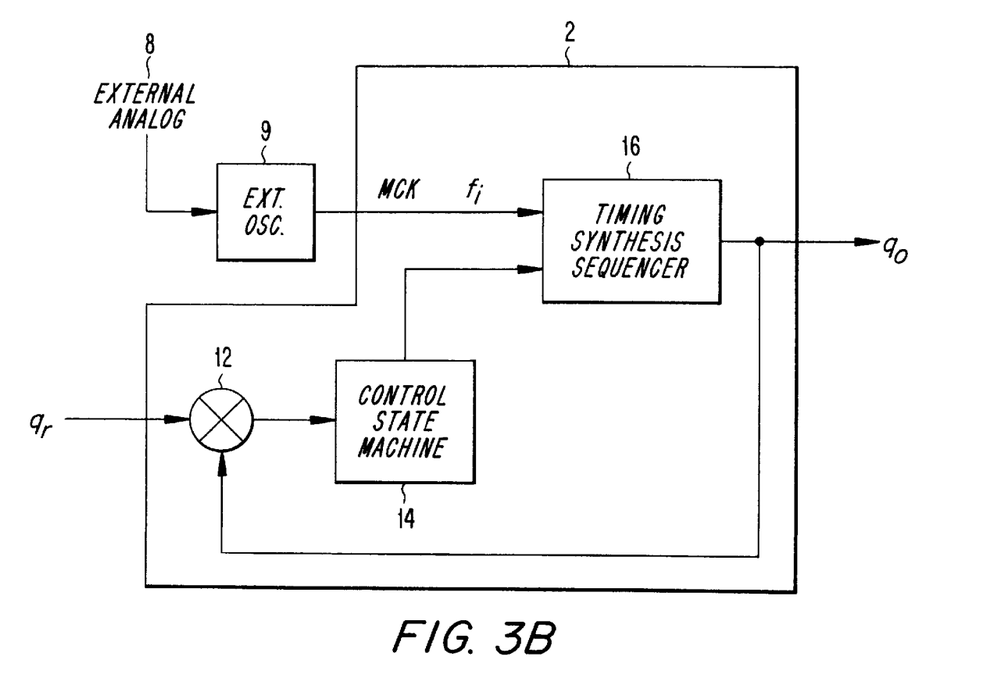
FIG. 3B is a block diagram of a discrete phase-locked loop.
Figure 3C:
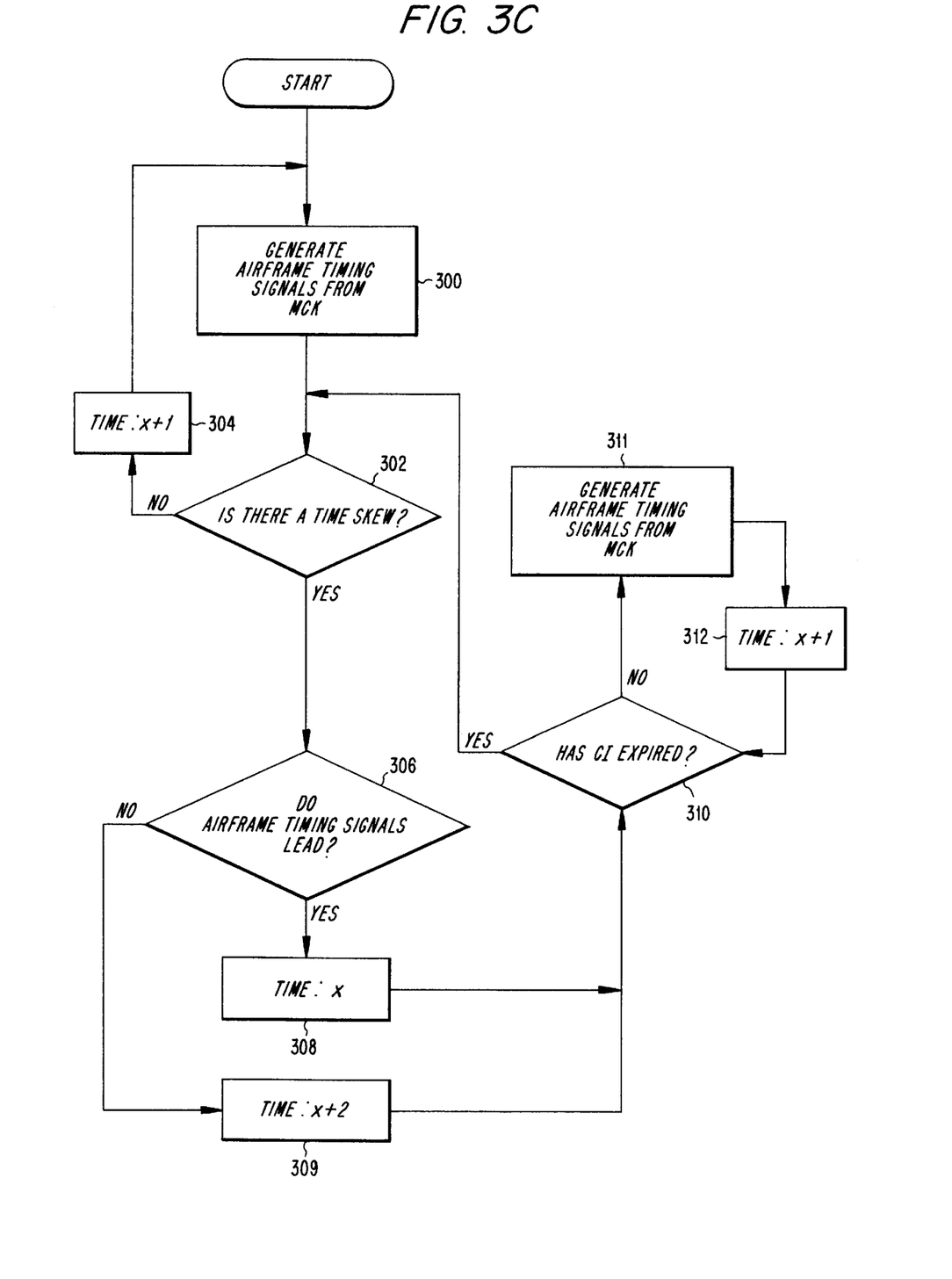
FIG. 3C is a flow chart illustrating an exemplary technique for performing slow synchronization using the digital PLL of FIG. 3B.

In an ideal case, there is no time skew between the generated output signal $q_o$ (e.g., airframe timing signals described below) and the distributed reference signal $q_r$ and the TSS 16 generates its output signal $q_o$ directly from MCK at step 300. As long as no time skew exists, as checked at step 302, then the binary counter increments by one quantum as shown in step 304. When there is a difference between the output signal $q_o$ and reference signal $q_r$, the difference is defined as a time skew and the flow follows the "Yes" branch from step 302. When a time skew between the generated output signal $q_o$ and the reference signal $q_r$ exists, the TSS 16 adjusts the timing of output signal $q_o$ by adding or removing a quantum of time to or from the generated output signal $q_o$. This time quantum is proportional to MCK. For instance, if the generated output signal $q_o$ is ahead of (i.e., leads) the reference signal in time as determined at step 306, then the CSM 14 will lag (i.e., delay) the TSS binary counter by one count by not incrementing the counter at step 308. The CSM 14 then waits for a correction interval (CI) to expire (step 310) during which time the output signal $q_o$ (e.g. the airframe timing signals) are generated from MCK at steps 311 and 312. Once the CI expires, if the generated output signal is still ahead of the reference signal, the process is repeated. The corrections are made relative to the last detected time skew so there will be no oscillating behavior introduced by the PLL. If, on the other hand, the generated output signal is after (i.e., lags) the reference signal at step 306, the CSM 14 will lead (i.e., skip ahead) the binary counter in the TSS by incrementing the counter by two at step 309. Again, the flow proceeds to blocks 310–312 where the CSM 14 waits for the CI to expire and perform another iteration.

One skilled in the art will recognize that the smaller the correction step is, the less jitter (and, therefore, less vector error) will be introduced to the system. Therefore, according to an exemplary embodiment of the present invention, the time quantum step is designed to be as small as possible. By regularly adjusting the generated output signals with the TSS 16, the timing signals become phase-locked to the distributed reference signal $q_r$. The TSS 16, control state machine 14, and phase comparator 12 can all be implemented in an ASIC or as software routines. This provides a significant reduction in the cost of making the discrete PLL 2 as compared with conventional, analog PLLs. Also with the elimination of the VCO and its replacement with a synthetic ASIC component, the size of the entire PLL can also be dramatically reduced.

Airframe Synchronization

Figure 4:
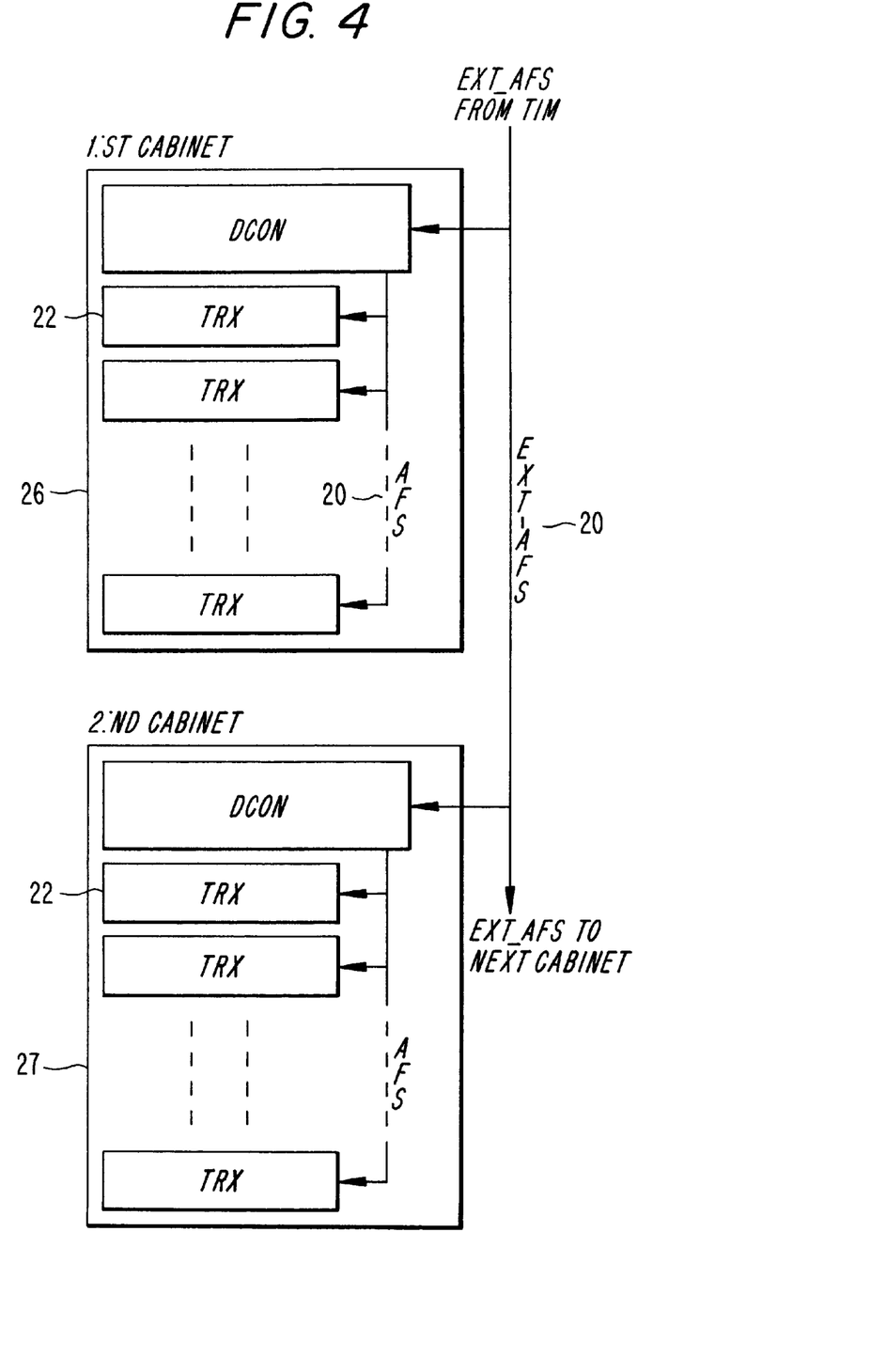
FIG. 4 is a block diagram of transceiver cabinets.

One application of the discrete PLL is the synchronization of airframe transmissions. According to an exemplary embodiment, an airframe is a digital packet containing six speech slots transmitted at a 25 Hertz rate, although those skilled in the art will appreciate that other numbers of slots and frame transmission rates may be used. FIG. 4 illustrates a base station transceiver cabinet 26, wherein the transceivers 22 transmit airframes to mobile units (not shown). In order to synchronize the airframes, airframe data clocks and synchronization signals are phase locked to a global time reference signal 20.

According to one exemplary embodiment of the present invention, a central timing unit (TIM) is provided (not shown), along with a local synchronization unit (not shown), to each transceiver 22. A timing reference signal AFS is distributed to all the transceivers from the TIM.

The TIM can be a unit located in the transceiver cabinet 26 or in a unit external to the transceiver cabinet 26. If external, the timing reference signal AFS 20 is input to the transceiver cabinet via an input port. The AFS signal 20 is then distributed internally within each cabinet to each transceiver (TRX) 22. The TRXs 22 lock their airframe timing to this reference signal using a digital PLL as described, for example, briefly above with respect to FIG. 3B and in more detail below. If the AFS 20 input to a TRX 22 is determined to be invalid (e.g., is missing or so distorted that it is unsuitable for use as a reference signal), then that TRX 22 unit can maintain its current phase relative to the master clock MCK (not shown in FIG. 4). Invalidity of the AFS 20 can be determined based on, for example, the signals SYMERROR 31 and SYMOVERRUN 32 (shown in FIGS. 5 and 6) which report signal distribution problems. The FGC will disregard incorrect portions of the AFS signal.

In each TRX 22, a PLL-VCO generates a master clock signal MCK 25 (seen in FIG. 5) having, for example, a frequency of 19.44 MHz. On the basis of this master clock signal, the frequency generator and correlator (FGC) function generates a set of frequencies and timing pulses which can be correlated to the AFS 20 signal. The correlated set of signals includes the following: FRAMESYNC, SAMPLERATE, FRAME_TX and FRAME_RX. FRAMESYNC is a pulse that indicates the generated frame time zero and is used for performance verification. SAMPLERATE is a bitrate for the frame transmit data, e.g., 194.4 kHz. FRAME_TX is a frame synchronization signal denoting the start of, for example, six speech data subframes in the transmit airframe. FRAME_RX is a frame synchronization signal indicating the start of the receiver listening window in other words where the receiver looks for the start of the first of six speech frames from the mobiles. SAMPLERATE, FRAME_TX and FRAME_RX can be phase adjusted to compensate for known delays in the AFS distribution and in the radio path. This phase adjustment is also used in the case of simulcasting. In the following discussion, these correlated signals are referred to collectively as airframe timing signals.

Frequency Generator and Correlator Unit

Figure 5:
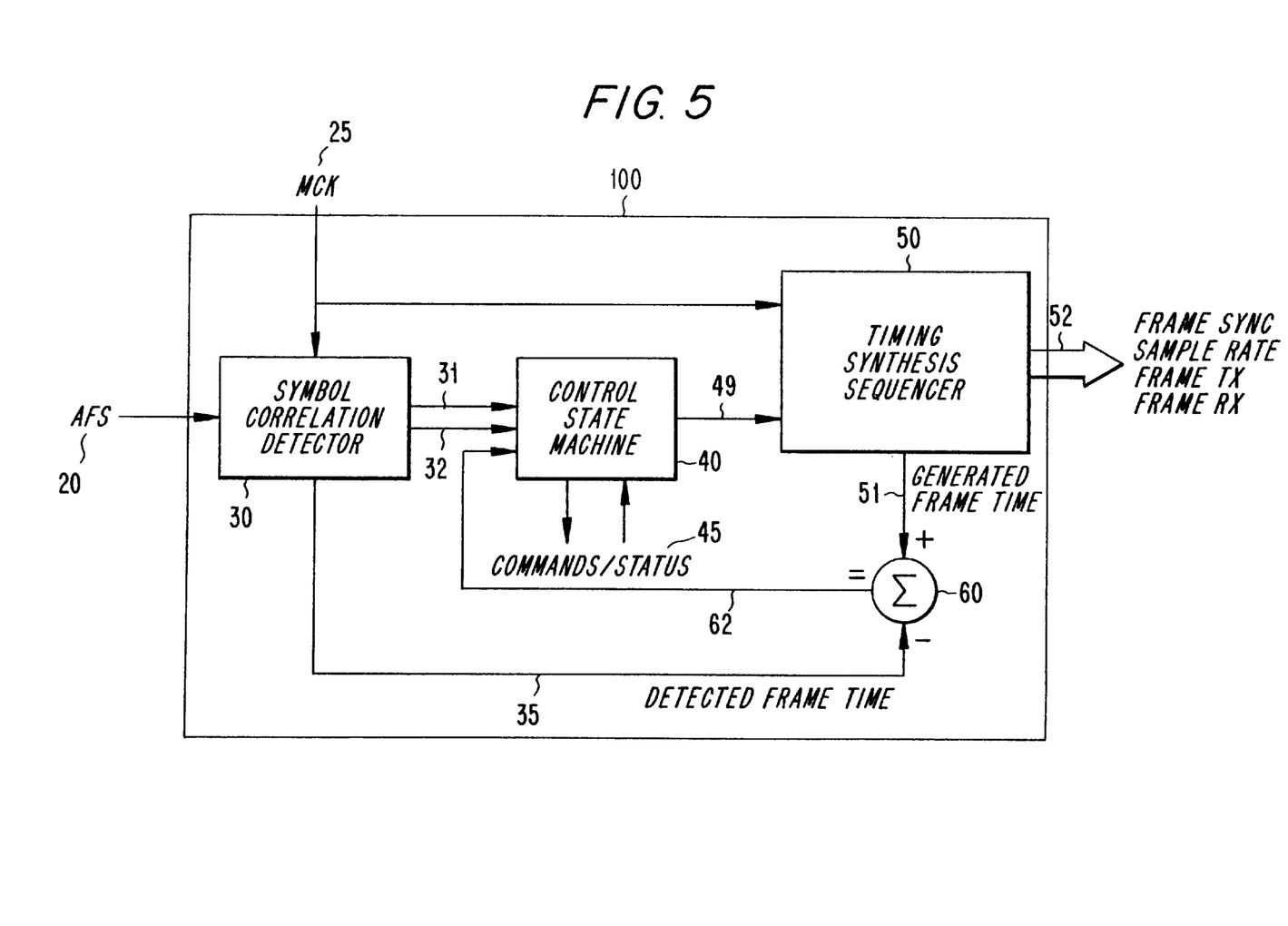
FIG. 5 is a block diagram of an implementation of the phase-locked loop in a frequency generator and correlator and according to an exemplary embodiment of the present invention.

FIG. 5 is a block diagram of the FGC 100 according to one exemplary embodiment of the present invention. The FGC 100 generates airframe timing signals 52 using master clock signal 25. In order to maintain synchronization with the timing reference signal AFS 20, the FGC 100 adds or removes a small time quantum at regular intervals on the generated airframe timing signals 52.

The global airframe timing is presented on the incoming timing reference signal, AFS 20, as a train of symbols. Each symbol represents a specific time in the airframe. The timing reference signal can be divided into an AFS1 signal and AFS2 signal. Each of the two signals carries a part of the composite AFS signal 20. In order to simplify the following description, the two signals, AFS1 and AFS2, will be commonly referred to as AFS 20, and where they differ, this will be noted. For the interested reader, a detailed description of an exemplary AFS signal including AFS1 and AFS2 can be found in U.S. patent application Ser. No. 08/764,935, entitled "Error Correcting Reference Distribution" to Johan Jansson and filed on the same day as the present application, the disclosure of which is incorporated herein by reference.

In order to generate the airframe timing signals 52 such that signals transmitted by various transmitters are synchronized to one another, the airframe timing signals are synchronized to a timing reference signal AFS 20. Once an AFS signal 20 is received, the signal is decoded by the transceiver unit 22. The transceiver unit 22 identifies and correlates the sync information and the continuous phase information included in AFS 20. According to another aspect of the present invention this can be accomplished through the use of a symbol correlation detector (SCD) 30.

Figure 6:
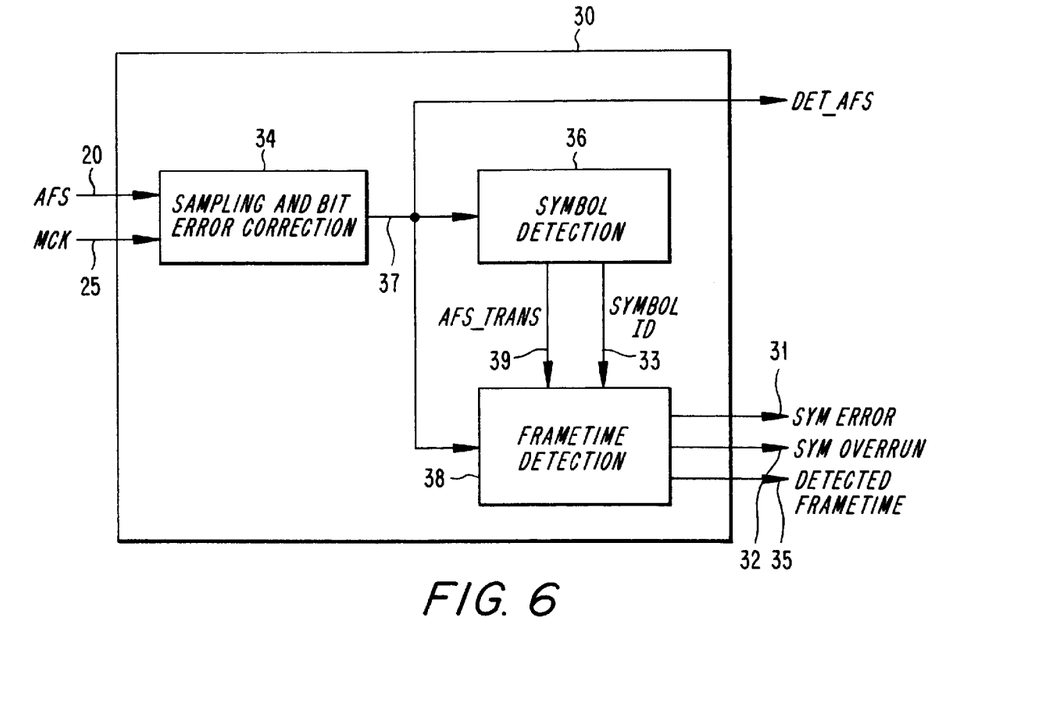
FIG. 6 is a block diagram of a symbol correlation detector according to an exemplary embodiment of the present invention.

The SCD 30 detects airframe timing provided by the AFS 20 signal by measuring the time between a current transition on the incoming timing reference signal and the last transition on AFS1 and AFS2, respectively. SCD 30 also measures the current signal level and detects transitions on the AFS1 and AFS2. FIG. 6 is an example of an SCD 30 according to an exemplary embodiment of the invention. The AFS signal 20 and master clock signal (MCK) 25 are fed into a sampling and bit error correction unit 34. After the AFS signal is sampled and corrected, it is output as a detected AFS (DET_AFS) signal 37. The DET_AFS signal 37 is then input into a symbol detection unit 36 to identify the symbols in the AFS signal to determine the encoded sync and phase information which is outputted as a strobe AFS_TRANS 39 and a value SYMBOL ID 33. These signals are then input into the frame time detection unit 38 along with the DET_AFS signal 37 in order to identify any symbol error or overrun, and the detected frame times, the results of which are output as signals 31, 32 and 35, respectively. The sampling and bit error correction unit 34 and the symbol detection unit 36 are duplicated, one for AFS1 and AFS2; and the frame time detection unit 38 uses the combination of these as AFS_TRANS1, AFS_TRANS2, SYMBOL_ID1, and SYMBOL_ID2. A more detailed description of signal symbol detection, error correction, and the SCD is provided in the above-identified and incorporated by reference U.S. Patent Application.

The SYMERROR 31 and SYMOVERRUN 32 signals are output from the SCD 30 to control state machine (CSM) 40 and the DETECTED FRAME TIME signal is output to a comparator 60 (FIG. 5). The GENERATED FRAMETIME signal 51 is also output to the comparator 60 from the TSS 50.

When there is a difference between the GENERATED FRAMETIME signal 51 (indicating the frame timing of the airframe timing signals 52) and the DETECTED FRAMETIME signal 35 (derived from AFS signal 20), a time skew has occurred. If no time skew is present between the airframe timing signals 52 and the AFS signal 20, the FGC 100 generates its output signals 52 directly from MCK signal 25. If there is a time skew between the airframe timing signals 52 and the AFS signal 20, the FGC 100 will adjust the timing of its output signals 52 by adding or removing a quantum of time to or from the airframe timing signals using TSS 50. The time quantum is proportional to the MCK signal 25. The time quantum can be a fixed value in the system, or it can be variable with changes being triggered, e.g., by system events. According to an exemplary embodiment of the present invention, the MCK 25 frequency of 19.44 megahertz implies a time quantum of 1,000 divided by 19.44 MHz, in other words, 51.44 nanoseconds. This equals 0.125% of a symbol time of the AFS signal 20.

By regularly adjusting the airframe timing signals 52 in the FGC 100, they become phase locked to the AFS signal 20. The FGC 100 takes commands from, and reports timing status to, a supervisor (not shown). The supervisor polls the registers of the control state machine (CSM) 40 at regular monitoring intervals to determine the status of the FGC. The supervisor can then fully operate the FGC 100 by writing commands to the CSM and reading status information from the CSM. The FGC is capable of autonomously maintaining synchronization with no intervention from the supervisor in order to conserve MIPS in the system CPU. However, the supervisor periodically monitors the status of the FGC 100 to ensure that correct airframe timing is output on signals 52. The TRXs 22 are not allowed to output bad frames to the mobiles. To ensure correct synchronization, the supervisor checks for bad reference signals, e.g., a sudden, high, out of specification skew of frames in time, and optionally intervenes in the process by, for example, disabling corrections, performing a fast resync, or disconnecting calls.

According to one exemplary embodiment, the supervisor could monitor the system to ensure that the maximum error E on the airframe timing signals 52 does not exceed some predetermined value, e.g., 2 microseconds. The value of E can be calculated from the following equations:

$$E = Efgc + Erf + Tpd + Em$$

where:
Efgc=the maximum error introduced by the FGC 100;
Erf=the radio path error;
Tpd=the maximum path delay of the AFS; and
Em=the error margin.

The maximum error introduced by the FGC 100 can be calculated from the equation:

$$Efgc = Q + Titv (Jm + Je)$$

where:
Q=the master clock period
Titv=the monitoring interval of the supervisor function;
Jm=the master clock jitter and wander error; and
Je=the AFS jitter and wander error.

Consider the following exemplary parameters. If Q=51.44 ns, Jm=0.25 ppm, Je=1.00 ppm and Titv=200 ms, then Efgc=301 ns. Then, assuming that Tpd=480 ns, Erf=1.2 $\mu$s and the maximum allowable airframe timing signal error is 2 $\mu$s, the error margin Em=49 ns.

Timing Synthesis Sequencer

Figure 7:
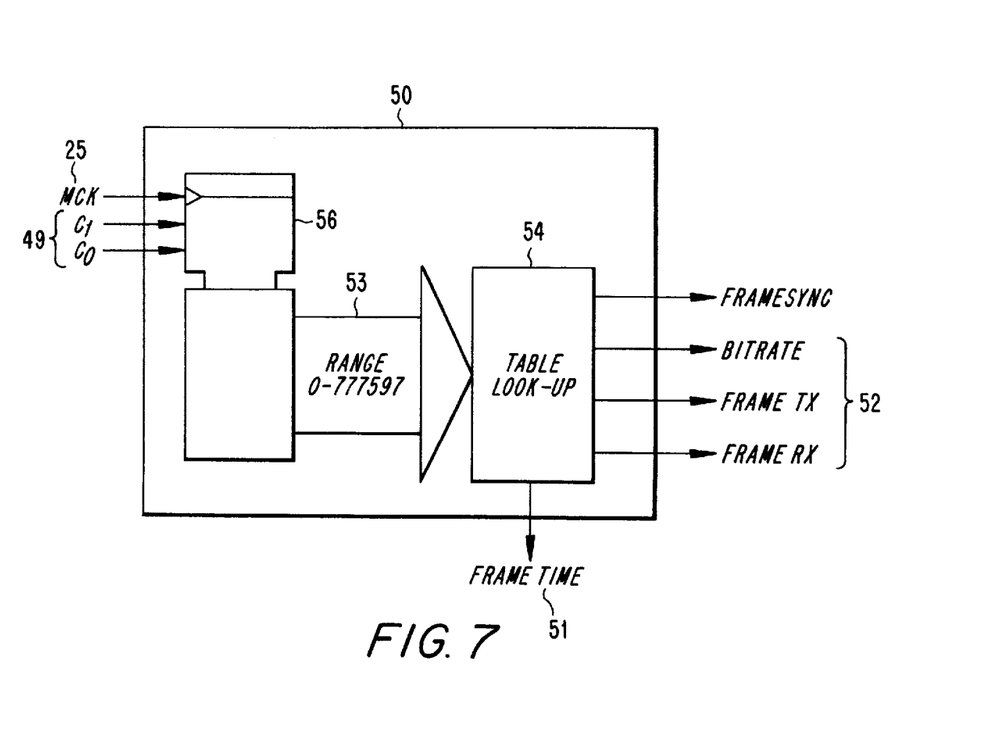
FIG. 7 is a block diagram of a timing synthesis sequencer according to an exemplary embodiment of the present invention.

Turning to FIG. 7, an example of a TSS 50 is shown. The TSS 50 generates the airframe timing signals 52 for a transmitter, e.g. TRX 22. The TSS 50 tracks its phase relative to the global AFS signal 20 using binary counter 56. This counter is updated on positive transitions of the MCK signal 25. The binary counter 56 is commanded by control state machine CSM 40. CSM 40 controls the counter 56 of the TSS 50 through controls 49 to operate in one of the following two states: (1) continuously increment by one to maintain an uncorrected airframe timing or (2) lead/lag one time quantum to correct airframe timing.

The interval that is used in the TSS 50 is set by the correction interval register (not shown). The correction interval register can, for example, be a 16 bit unsigned register in the ASIC that is writable by control software. The minimum allowed correction interval can be, for example, 5.144 $\mu$s. The correction interval can be set as a multiple of the SAMPLERATE interval, e.g., from once every SAMPLERATE interval up to every 337 microseconds. This implies that the generated SAMPLERATE and associated strobes (FRAME_TX and FRAME_RX) will, in a worst case situation, deviate plus/minus one percent in frequency. The interval can be synchronized to system events. For example, when arriving at the end of the correction interval, the time adjustment can be delayed until the next occurrence of a certain system event. Moreover, because frequency error will be propagated into the RF circuitry it should be accounted for or the TRX should be shut off when any frequency errors that do not meet the system designer's requirements are present.

According to one exemplary embodiment of the invention, the counter 56 operates modulo 777600, and follows the equation X=MOD (F(x), 777600), where F(x) is [X;X+1; X+2] to increment the counter by one or two or not at all for one MCK interval. The counter outputs a 20 bit binary representation of the generated frametime on bus 53 (Note this is the same as the GENERATED FRAMETIME 51 in FIG. 7) to the look-up table 54. The signals needed by the transmit and receive circuitry are generated out of the look-up table 54 based on the generated value of bus 53.

The outputs of the TSS are compared to the DETECTED FRAMETIME 35 from the SCD 30 to determine the worst case phase deviation relative to the AFS signal 20. The worst case phase deviation is presented to the supervisor in the frame skew register (not shown). Signals that are to be synchronized with the AFS signal 20 are generated by a combinatorial logic net (not shown) driven by the counter output. The outputs 52 of the TSS 50 can be forced to their inactive states by negating control bit (TSSEnables). The outputs 52 will resume operation when this control bit is asserted.

The FGC 100 unit should generate its output signals correctly, when the supervisor enables or disables them. It is desirable that doubled pulses and burst trains not appear on the generated signals. The airframe timing signals 52 also should remain in their inactive (de-asserted) state when disabled otherwise spurious interrupt/lock outs and other fatal errors could occur. The control state machine 40 manages the timing synthesis sequencer 50 on the basis of the quality information from the symbol correlation detector and the settings of the control signals from the supervisor.

Figure 8:
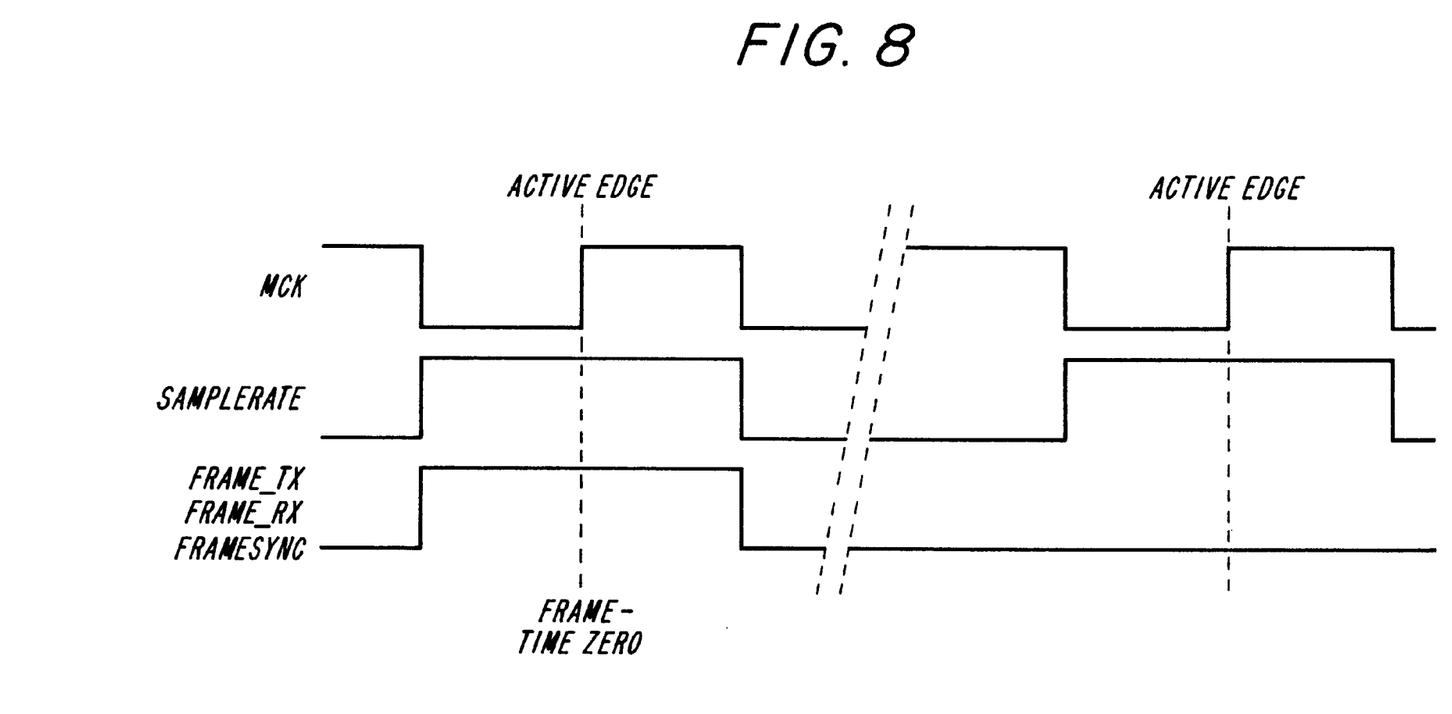
FIG. 8 illustrates phase relations of the signal generated by the timing synthesis sequencer in comparison to a master clock signal.

The FRAMESYNC, SAMPLERATE, FRAME_TX, and FRAME_RX signals are distributed in such fashion that the MCK signal carries the exact timing. The signals FRAMESYNC, SAMPLERATE, FRAME_X, and FRAME_RX are to be latched in, on the next positive transition on MCK in order to avoid race conditions. FIG. 8 is an example of an exemplary embodiment for setting registers (not shown) SampleDelay, FRAME_TXDelay, and FRAME_RXDelay to 0. The registers can be written to by control software to adjust the timing on the signals SAMPLERATE, FRAME_TX, and FRAME_RX respectively.

The timing is logically generated so that the signal FRAMESYNC indicates frame time zero, and the SAMPLERATE signal is aligned to FRAMESYNC. Then, the FRAME_TX and FRAME_RX signals are aligned to the SAMPLERATE signal. The SAMPLERATE signal can, in digital mode, be delayed from the FRAMESYNC time in 0–99 steps of, e.g., 51.44 ns by the delay stored in the SampleDelay register. In digital mode, the SAMPLERATE interval is 100 multiplied by the time quantum 51.44 ns. (=5144 ns). In digital mode, the FRAME_TX and FRAME_RX signals can be delayed over the whole frame time of, for example, 40 ms, relative to the FRAMESYNC signal in steps of SAMPLERATE. The FRAME_TX Delay and FRAME_RX Delay registers set the corresponding frame time.

The speed of the phase adjustment can be set in the correction interval register in TSS 50. There are two limits on the correction interval for slow synchronization. According to one preferred embodiment, if the correction interval is set to be more often than each time slot period, e.g., 6.7 ms for IS-54 systems, the RMS vector error of the modulation will be violated. Second, if the correction interval is set to be more often than 10.3 ms, then the requirements on absolute frequency deviation will be violated. If these limits are met then the phase adjustments can be maintained even when the TRX 22 is servicing calls. Those skilled in the art will appreciate that other numerical values for the limits on the correction interval can be applied depending upon the parameters of the system in which the invention is employed.

At the base station or site startup, the airframe timing of the different channels of the site will be uncorrelated. No transmitters will be active. The airframe timing can be correlated much faster in this stage than in the site that is up and running calls because the output timing of the FGC will not be propagated through the transmitter. Therefore, there are at least two synchronization speeds, fast and slow.

Fast synchronization will typically be achieved within two seconds, however, required airframe timing is not met. The control level must make sure that the functions dependent upon the generated airframe timing signals from the FGC can handle the timing errors generated during fast sync. In addition the frequency error will be propagated into the RF circuitry. This should be accounted for to prevent the transmitter from shutting off when any frequency errors occur that do not meet the requirements of maximum vector error and data clock rate (e.g., 5 PPM).

Slow synchronization will, in a worst case situation, be achieved in about 70 minutes with required airframe timing being met. The control level (shown in FIG. 9) initiates slow or fast synchronization by sending the appropriate commands to the supervision level. For example, implementation of a digital control channel (e.g., as specified in EIA/TIA IS-136) depends upon slow synchronization to maintain service simultaneously with airframe synchronization. Synchronization can be totally disabled by setting the synchronization correction interval to zero. When this is done corrections will cease immediately.

Airframe Synchronization Supervisor

Figure 9:
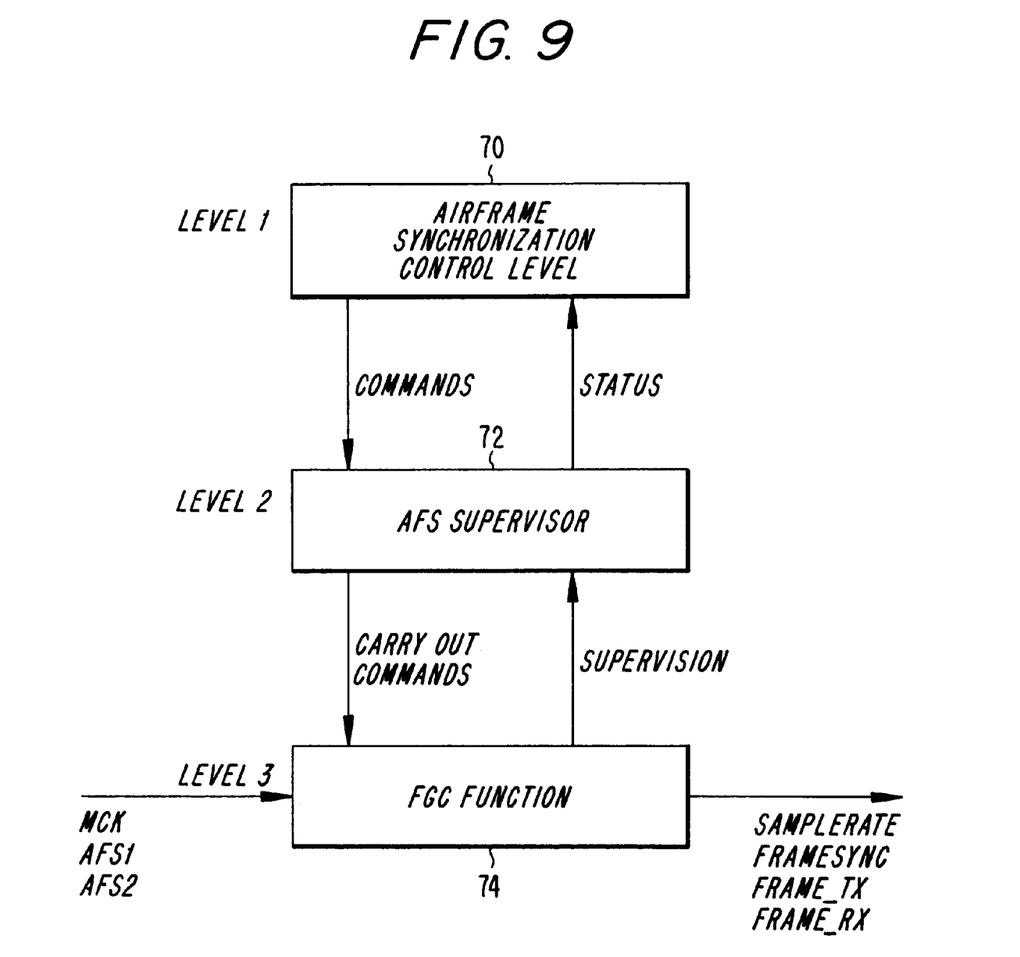
FIG. 9 is a diagram of an exemplary system hierarchy.

FIG. 9 illustrates the various exemplary system levels of systems according to the present invention.

According to an exemplary embodiment of the invention, the AFS supervisor function can be implemented in software. The airframe synchronization supervisor 72 includes software routines that manage the hardware function of the FGC 74 and act as an interface between the control level 70 and the FGC 74. Commands are read from the control level 70 and status information is returned. The supervisor 72 polls the FGC 74 status at regular intervals to monitor continued synchronization. This interval should be calculated to be at least as often as indicated above to ensure airframe timing, i.e., to ensure that polling is performed sufficiently frequently by the supervisor.

Figure 10A:
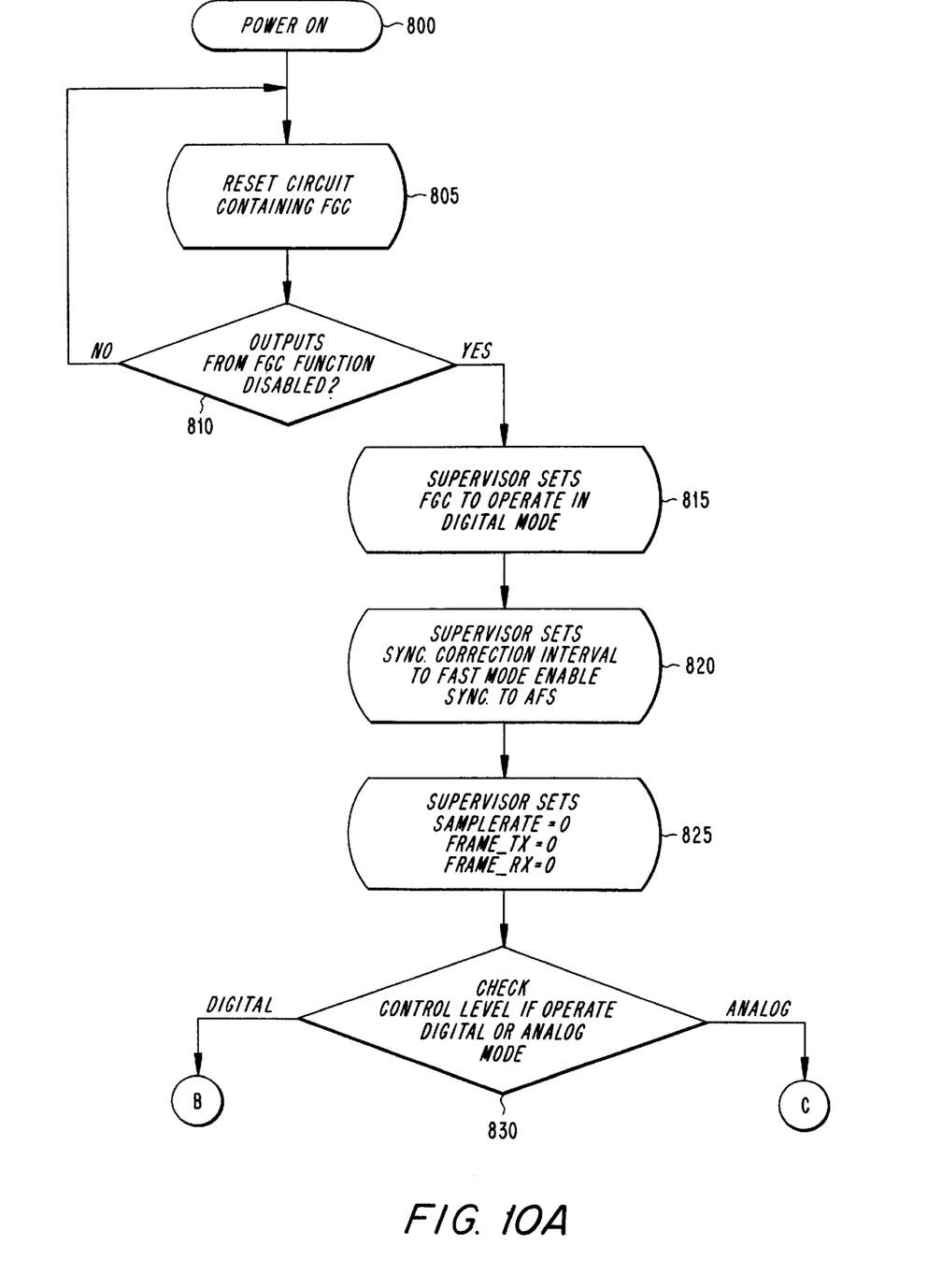
FIGS. 10A–C are flow charts of exemplary analog/digital mode operations according to the present invention.
Figure 10B:
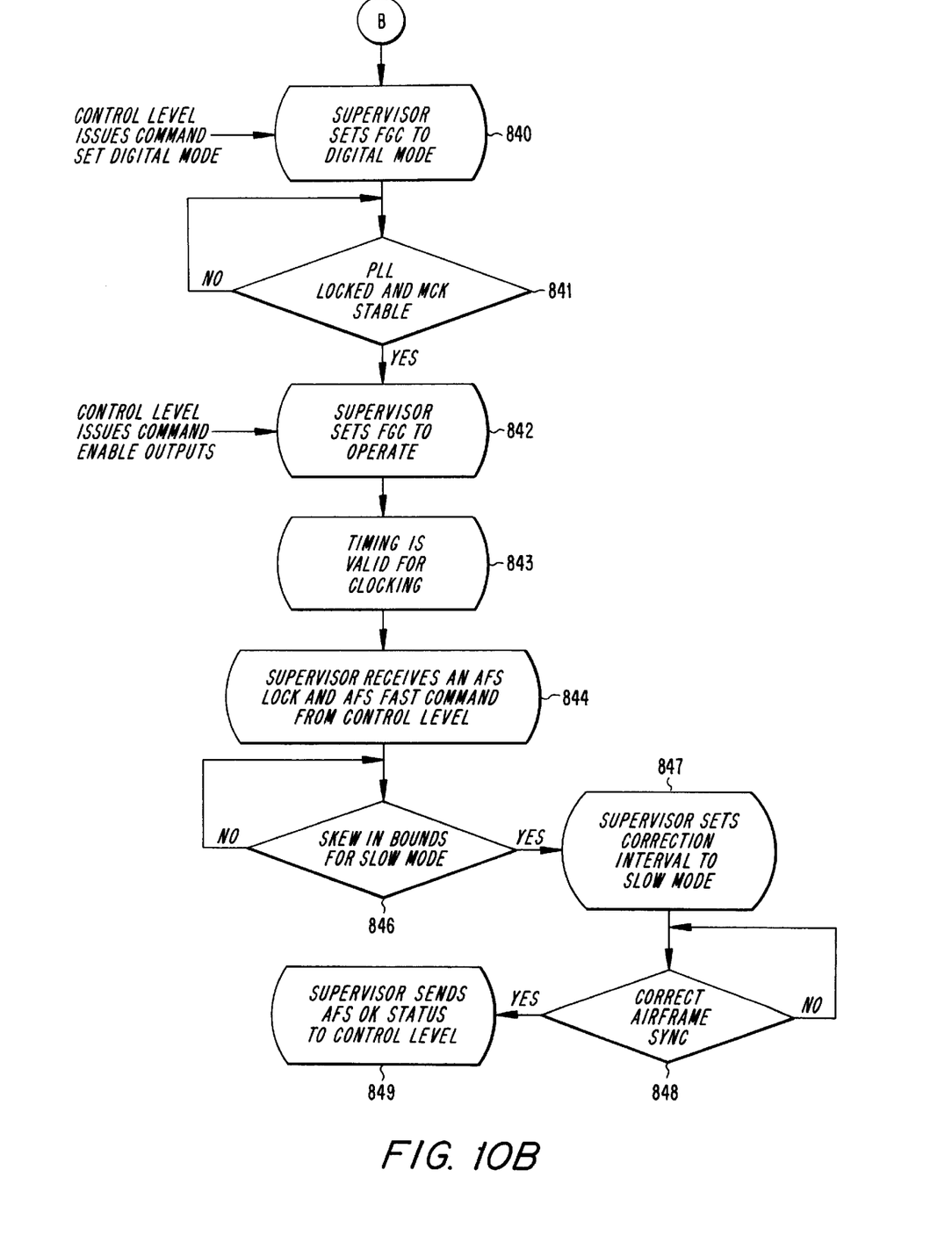
Figure 10C:
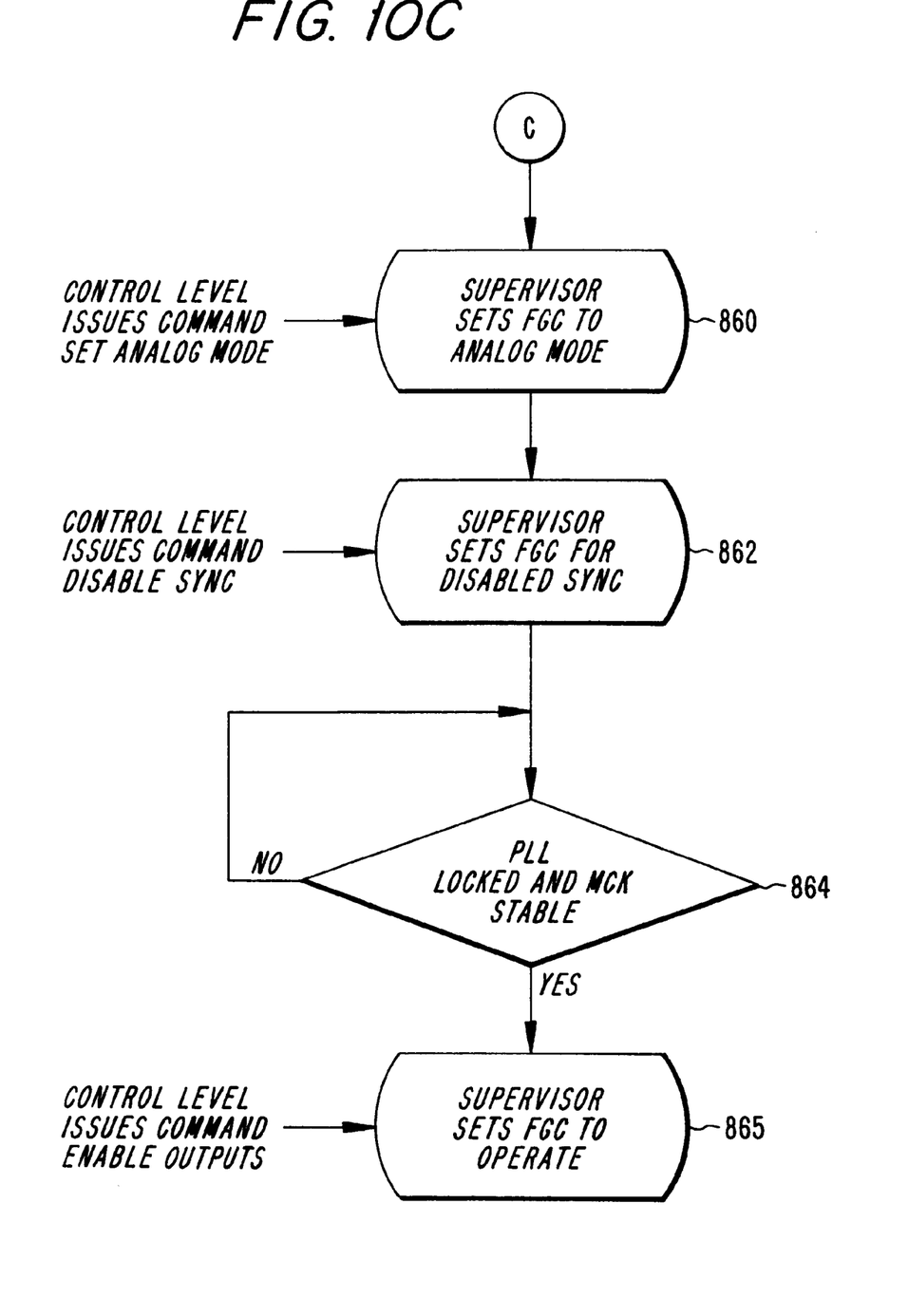

FIGS. 10A–10C illustrate an exemplary supervision process. During normal operation from power on (step 800) of the system, outputs of the FGC function are disabled by the supervisor. A reset (step 805) of a circuit that contains the FGC function will disable these outputs, however as a precaution, the supervisor can check at step 810. The supervisor then sets the FGC function to operate in digital mode at step 815. The supervisor then sets the synchronization correction interval to the fast synchronization mode and enables synchronization to AFS at step 820. The supervisor sets (step 825) the SampleDelay, FRAME_TX Delay and FRAME_RX Delay registers to, for example, zero. After this point, the operation depends on whether the TRX operates in digital or analog traffic mode as determined at step 830. During analog traffic mode, shown in FIG. 10C, the control level issues a set analog traffic mode command. The FGC function is then set to analog traffic mode by the supervisor at step 860. The control level issues a disabled sync command and the FGC function is set up for disabled synchronization by the supervisor at step 862. The control level then waits until the clock stabilization PLL has locked at step 864, and the MCK clock is stable. The control level then issues an enable output command and the supervisor sets the FGC function to operate at step 865. The timing signals generated by the FGC are then valid from this point on.

In the digital traffic mode of operation shown in FIG. 10B, the control level issues a set digital mode command and the FGC function is set to the digital traffic mode by the supervisor at step 840. The control level then waits until the clock stabilization PLL has locked and the MCK clock is stable at step 841. The control level issues an enable outputs command and the supervisor sets the FGC function to operate at step 842. Timing is then valid for clocking the transmit and receiver circuitry in a blocked transceiver as illustrated by step 843. The supervisor receives an AFS lock and the AFS fast command from the control level at step 844. The supervisor then monitors the frame skew register of the FGC function until it sees that the skew is in bounds (step 846) for a slow synchronization to be possible within the acceptable time limit. The supervisor then sets the synchronization correction interval to slow synchronization mode at step 847 and waits for the FGC function to achieve correct airframe synchronization at step 848. The supervisor then sends an AFS OK status message to the control level at step 849.

Analog V. Digital Phase Lock

Figure 11:
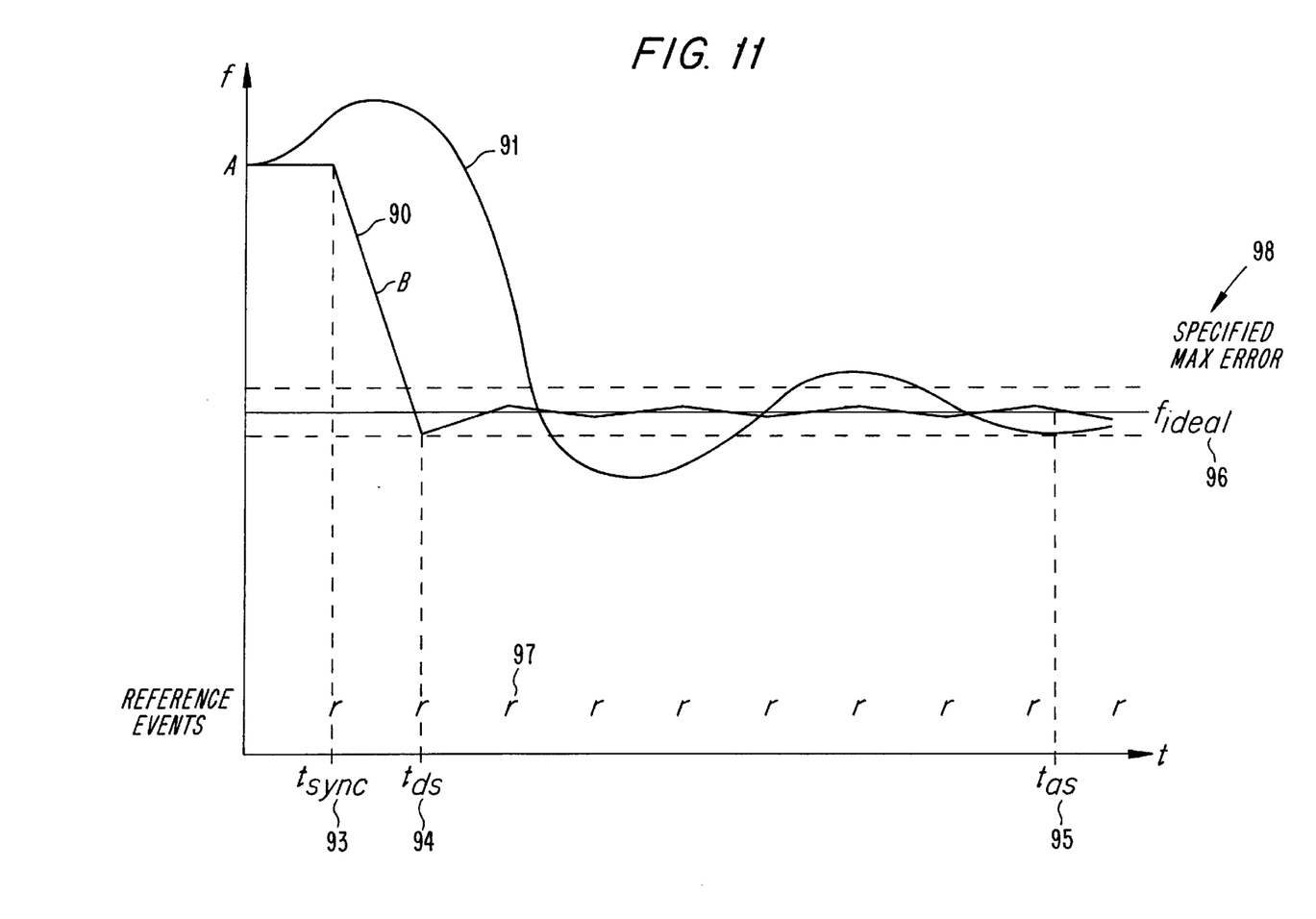
FIG. 11 is a graph which illustrates phase locking for an analog PLL versus a digital PLL.

FIG. 11 illustrates the performance of a conventional analog PLL versus the performance of a digital PLL according to an exemplary embodiment of the present invention. The graph shows frequency error/deviation v. time. Curve 91 displays a typical fast phase lock for an analog signal and analog phase-locked loop. The analog PLL frequency error will not remain still without receiving a reference signal. When the analog PLL receives a reference signal it will make a jump before gradually achieving a phased-lock at point $t_{as}$. The low-pass filter of the analog phase-locked loop has an inherent settling time for the system to remain within an acceptable maximum specified error 98 and final lock to the ideal frequency 96. This process can take on the order of 30 to 70 minutes. This makes implementation, according to modem telecommunication service demands and standards, extremely unpractical.

If there is too much frequency error in a signal, a receiver will have too large a bit or vector error and when this goes past a certain limit communication between the transmitter and receiver will be lost. Therefore it is desirable to have a stable clock in a locked condition for transmitting to the receiver so that the frequency is adjusted only a little over a relatively long time. When a base station is servicing calls to a mobile, and a system error occurs caused by a loss of power, system soft reboot, or loss of a data connection to the switch, loss of AFS reference, or loss of radio frequency reference, it is important that the base station is able to maintain synchronization and keep down time to a minimum.

The present invention solves the problem of achieving a fast sync through use of the above-described digital PLL solution. For example, for the frequency deviation 90 and an exemplary discrete phase-locked loop having a skew A as shown in FIG. 11, during the fast synchronization period between times $t_{sync}$ 93 and $t_{ds}$ 94, it is desirable for the synchronization period to be as short as possible. Reference events 97 indicated in FIG. 11 refer to the detection of a "Frametime Zero" occurrence from the information presented on the timing reference signal. Unlike the analog phase-locked loop, a discrete phase-locked loop according to the present invention can adjust the slope B to bring it into synchronization quickly (i.e., Fast Sync) and then switch to maintain a lock condition using a slow synchronization (i.e., Slow Sync) by adjusting the phase slightly over a long period of time. However, when the slope B is adjusted the signal is degraded at the receiver and communications can be lost. Therefore, in the discrete phase-locked loop solution, the slope B is adjusted within an acceptable limit designed to minimize the risk of losing communications while still resulting in a fast lock and then further adjusted slowly to maintain the lock within the maximum specified error. Accordingly, fast lock can be attainted within, for example, about 2 seconds and slow lock, in a worst case of, for example 70 minutes. This helps minimize system down times and provides a reference signal with very little frequency jitter. For the digital phase-locked loop, the AFS jitter and wander error Je and the MCK jitter and wander error Jm causes a frequency deviation from the desired frequency $f_{ideal}$, as indicated in FIG. 11 (for a worst case). This frequency deviation must remain within the specified max error 98. From the example at page 12 it can be seen that this measurement error Jm+Je remains within ±50 ns=(1 ppm+0.25 ppm)·40 ms (the frame time). This is a dramatic improvement over prior analog systems.

The foregoing discussion relates primarily to digital transmissions, i.e., digitally modulated signals. However, those skilled in the art will recognize that many so-called "dual-mode" systems exist which support both analog and digital transmissions. When a dual-mode base station is operating in its analog mode, there is no need for airframe synchronization as there are no airframes present. The analog air interface is simply audio samples that are FM modulated and therefore are already generated with a sufficiently stable frequency.

The present invention has been described by way of example, and modifications and variations of the exemplary embodiments will suggest themselves to skilled artisans in this field without departing from the spirit of the invention. The preferred embodiments are merely illustrative and should not be considered restrictive in any way. The scope of the invention is to be measured by the appended claims, rather than the preceding description, and all variations and equivalents which fall within the range of the claims are intended to be embraced therein.

What is claimed is:

1. A base station comprising:
    an input port for receiving a timing reference signal;
    at least one transceiver for transmitting information, which is grouped into frames, using airframe timing signals to determine times to transmit said frames;
    a digital phase-locked loop for digitally locking said airframe timing signals to said timing reference signal; and
    wherein said digital phase-locked loop uses said timing reference signal and a master clock signal to selectively add at least one time quantum to said airframe timing signals subsequent to a selectable correction interval to lock said airframe timing signals to said timing reference signal and wherein said selectable correction interval is independent of a length of said at least one time quantum.

2. The base station of claim 1, wherein said at least one time quantum is positive.

3. The base station of claim 1, wherein said at least one time quantum is negative.

4. The base station of claim 1, wherein said digital phase-locked loop comprises:

a symbol correlation detector, which receives as an input said timing reference signal, for measuring a time between transitions on the timing reference signal to generate a detected frame time signal.

5. The base station of claim 4, wherein said symbol correlation detector comprises:

means for determining if said timing reference signal is valid and generating at least one control signal in response thereto.

6. The base station of claim 5, wherein said digital phase-locked loop further comprises:

a control state machine for receiving said at least one control signal and a time skew indication signal, and for outputting a timing control signal.

7. The base station of claim 6, wherein said digital phase-locked loop further comprises:

a timing synthesis sequencer for receiving said timing control signal and said master clock signal and for generating said airframe timing signals and a generated frame time signal.

8. The base station of claim 7, wherein said digital phase-locked loop further comprises:

a phase comparator for comparing phases of said generated frame time signal and said detected frame time signal and for outputting said time skew indication signal as a result of said comparison.

9. The base station of claim 7, wherein the function of selectively adding at least one time quantum further performs the functions of:

(a) incrementing by one quantum when said airframe timing signals should be uncorrected;

(b) incrementing by two quanta when said generated frame time signal lags said detected frame time signal; and (c) incrementing by zero quanta when said generated frame time signal leads said detected frame time signal.

10. The base station of claim 9, wherein said at least one time quantum is established by a system parameter.

11. The base station of claim 6, wherein the control state machine receives commands from, and reports status to, supervisory software.

12. The base station of claim 11, wherein said supervisory software compares an error associated with said timing reference signal to a predetermined threshold.

13. The base station of claim 1, wherein said digital phase-locked loop is settable to operate in at least two modes: fast synchronization mode and slow synchronization mode.

14. The base station of claim 13, wherein said fast synchronization mode establishes a locked condition within about 2 seconds.

15. The base station of claim 13, wherein said slow synchronization mode establishes a locked condition within about 70 minutes.

16. The base station of claim 13, wherein said fast and slow synchronization modes are set in a correction interval register.

17. An apparatus comprising:

means for receiving a timing reference signal;

means for transmitting information, which is grouped into frames, using airframe timing signals to determine times to transmit said frames; and means for locking said airframe timing signals to said timing reference signal using said timing reference signal and a master clock signal to selectively add at least one time quantum to said airframe timing signals subsequent to a selectable correction interval to lock said airframe timing signals, wherein said selectable correction interval is independent of a length of said at least one time quantum.

18. The apparatus of claim 17, wherein said at least one time quantum is positive.

19. The apparatus of claim 17, wherein said at least one time quantum is negative.

20. The apparatus of claim 17, wherein said means for locking comprises:

means for measuring a time between transitions on the timing reference signal to generate a detected frame time signal.

21. The apparatus of claim 20, wherein said means for measuring comprises:

means for determining if said timing reference signal is valid and generating at least one control signal in response thereto.

22. The apparatus of claim 21, wherein said means for locking further comprises:

means for receiving said at least one control signal and a time skew indication signal, and for outputting a timing control signal.

23. The apparatus of claim 22, wherein said means for locking further comprises:

means for receiving said timing control signal and said master clock signal and for generating said airframe timing signals and a generated frame time signal.

24. The apparatus of claim 23, wherein said digital phase-locked loop further comprises:

means for comparing phases of said generated frame time signal and said detected frame time signal and for outputting said time skew indication signal as a result of said comparison.

25. The apparatus of claim 23, wherein the function of selectively adding at least one time quantum further performs the functions of:

(a) incrementing by one quantum when said airframe timing signals should be uncorrected;

(b) incrementing by two quanta when said generated frame time signal lags said detected frame time signal; and (c) incrementing by zero quanta when said generated frame time signal leads said detected frame time signal.

26. The apparatus of claim 25, wherein said at least one time quantum is established by a system parameter.

27. The apparatus of claim 22 wherein the means for receiving said at least one control signal receives commands from, and reports status to, supervisory software.

28. The apparatus of claim 27, wherein said supervisory software compares an error associated with said timing reference signal to a predetermined threshold.

29. The apparatus of claim 17, wherein said means for locking is settable to operate in at least two modes: fast synchronization mode and slow synchronization mode.

30. The apparatus of claim 29, wherein said fast synchronization mode establishes a locked condition within about 2 seconds.

31. The apparatus of claim 29, wherein said slow synchronization mode establishes a locked condition within about 70 minutes.

32. The apparatus of claim 29 wherein said fast and slow synchronization modes are set in a correction interval register.

* * * * *